US007667978B2

(12) United States Patent
Nagasaka et al.

(10) Patent No.: US 7,667,978 B2
(45) Date of Patent: Feb. 23, 2010

(54) ELECTRONIC PACKAGE ENCAPSULATING ELECTRONIC COMPONENTS THEREIN

(75) Inventors: Shinsuke Nagasaka, Kariya (JP); Kazuo Katoh, Nagoya (JP); Akira Shintai, Chita (JP); Takashi Aoki, Toyoake (JP)

(73) Assignee: DENSO CORPORATION, Kariya (JP)

( * ) Notice: Subject to any disclaimer, the term of this patent is extended or adjusted under 35 U.S.C. 154(b) by 237 days.

(21) Appl. No.: 11/826,552

(22) Filed: Jul. 17, 2007

(65) Prior Publication Data
US 2008/0130246 A1    Jun. 5, 2008

(30) Foreign Application Priority Data
Dec. 4, 2006    (JP)    ............................. 2006-327191

(51) Int. Cl.
*H01R 7/00*    (2006.01)
(52) U.S. Cl. ...................................... 361/772; 361/760
(58) Field of Classification Search .................. 361/772, 361/760
See application file for complete search history.

(56) References Cited

U.S. PATENT DOCUMENTS

| | | | |
|---|---|---|---|
| 5,353,498 A | 10/1994 | Fillion et al. | |
| 5,866,952 A | 2/1999 | Wojnarowski et al. | |
| 6,046,072 A | 4/2000 | Matsuura et al. | |
| 6,147,374 A * | 11/2000 | Tanaka et al. | ................ 257/295 |
| 6,248,613 B1 | 6/2001 | Matsuura et al. | |
| 6,372,080 B1 | 4/2002 | Matsuura et al. | |
| 6,441,416 B1 | 8/2002 | Tanaka et al. | |
| 6,465,827 B2 | 10/2002 | Tanaka et al. | |
| 6,525,359 B2 | 2/2003 | Tanaka et al. | |
| 6,558,791 B2 | 5/2003 | Matsuura et al. | |
| 6,617,630 B2 | 9/2003 | Tanaka et al. | |
| 6,657,245 B2 | 12/2003 | Tanaka et al. | |
| 6,847,125 B2 | 1/2005 | Tanaka et al. | |
| 7,064,368 B2 | 6/2006 | Tanaka et al. | |

(Continued)

FOREIGN PATENT DOCUMENTS

JP    A-2000-200864    7/2000

OTHER PUBLICATIONS

Office Action dated Jan. 21, 2009 in corresponding German patent application No. 10 2007 032 074.6-33 (and English translation).

*Primary Examiner*—Jinhee J Lee
*Assistant Examiner*—Andargie M Aychillhum
(74) *Attorney, Agent, or Firm*—Posz Law Group, PLC

(57) ABSTRACT

An electronic component unit including a metallic member and an electronic component, such as a semiconductor element, mounted on the metallic member is encapsulated with molding resin such as epoxy resin, thereby forming an electronic package. The electronic component unit is covered with primer made of a material such as resin to increase an adhesive force of the molding resin to the electronic component unit. A glass transition temperature of both of the molding resin and the primer is set to a temperature higher than 200° C. to keep the adhesive force unchanged at least up to the ambient temperature of 200° C. and to secure a reliability of the electronic package. A metallic lead wire connected to the electronic component may be encapsulated together with the electronic component unit. An entire surface of the electronic component unit may be covered with the primer to further improve the adhesive force.

2 Claims, 2 Drawing Sheets

U.S. PATENT DOCUMENTS

| | | | |
|---|---|---|---|
| 2005/0248014 A1* | 11/2005 | Tanaka et al. | 257/678 |
| 2006/0080348 A1* | 4/2006 | Cesana et al. | 707/101 |
| 2006/0199923 A1 | 9/2006 | Akiba et al. | |
| 2006/0216520 A1 | 9/2006 | Osada | |
| 2007/0145547 A1* | 6/2007 | McKerreghan et al. | 257/676 |

* cited by examiner

US 7,667,978 B2

ELECTRONIC PACKAGE ENCAPSULATING ELECTRONIC COMPONENTS THEREIN

CROSS-REFERENCE TO RELATED APPLICATION

This application is based upon and claims benefit of priority of Japanese Patent Application No. 2006-327191 filed on Dec. 4, 2006, the content of which is incorporated herein by reference.

BACKGROUND OF THE INVENTION

1. Field of the Invention

The present invention relates to a molded package for encapsulating electronic components therein.

2. Description of Related Art

A package encapsulating an electronic component unit having an electronic component mounted on a metallic member with molding resin has been known hitherto. An example of this kind of package is disclosed in JP-A-2006-299246. An electronic component is encapsulated with epoxy resin, forming an electronic package. Generally, the electronic component unit is covered with primer, and then it is molded with resin such as epoxy so that the molding resin sufficiently adheres to the electronic component unit.

The electronic package of this kind is becoming small in size to be easily mounted on an automotive vehicle, for example, and an mount of heat generated in the electronic component unit is becoming high. This results in increase in temperature of the electronic package. As the temperature of the package becomes higher, an adhesive force of the molding resin to the electronic component unit becomes lower, and reliability of the package cannot be maintained. According to test results, the reliability of a conventional package is maintained only up to a temperature of about 150° C.

SUMMARY OF THE INVENTION

The present invention has been made in view of the above-mentioned problem, and an object of the present invention is to provide an improved electronic package encapsulating an electronic component unit therein, wherein reliability of the electronic package is secured up to a temperature of 200° C.

An electronic component unit that includes a metallic member and an electronic component such as a semiconductor element mounted on the metallic member is encapsulated with molding resin, thereby forming an electronic package. To enhance an adhesive force of the molding resin to the electronic component unit, a surface of the electronic component unit is covered with primer made of a material such as resin.

In order to secure reliability of the electronic package up to the ambient temperature of 200° C., the molding resin and the primer, both having a glass transition temperature higher than 200° C., are used. In this manner, both of the molding resin and the primer are kept unchanged at least up to 200° C., and the adhesive force of the molding resin is maintained. Thus, reliability of the electronic package is secured at least up to the ambient temperature of 200° C.

A metallic lead wire connected to the electronic component mounted on the metallic member through a bonding wire may be also encapsulated with the molding resin. An entire surface of the electronic component unit may be covered with the primer to further enhance the bonding force between the molding resin and the electronic component unit.

Other objects and features of the present invention will become more readily apparent from a better understanding of the preferred embodiment described below with reference to the following drawings.

DETAILED DESCRIPTION OF THE PREFERRED EMBODIMENT

Figure 1:
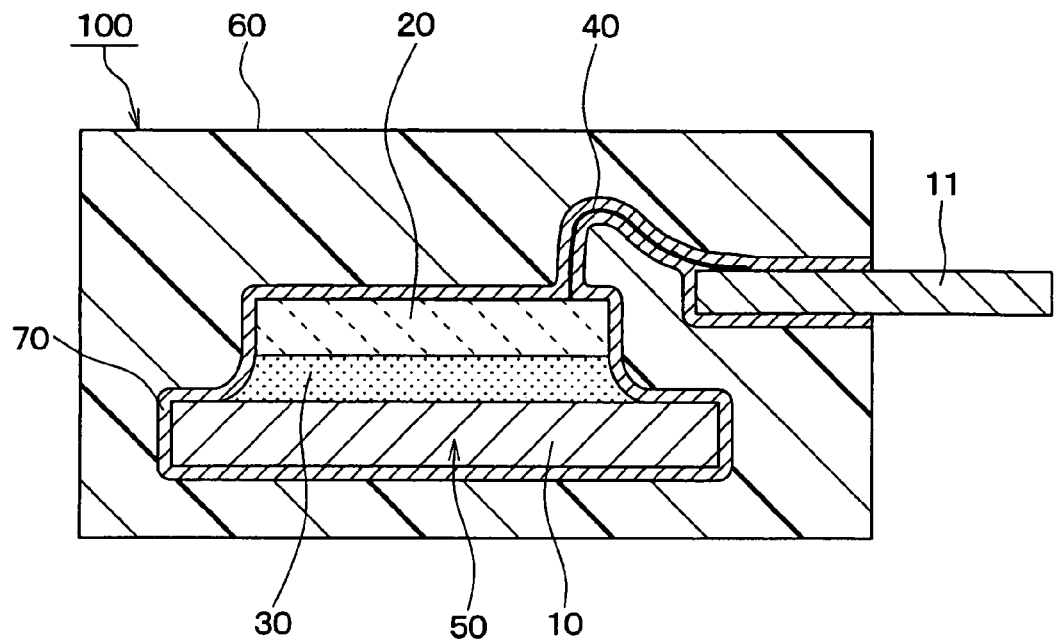
FIG. 1 is a cross-sectional view showing an electronic package encapsulating an electronic component unit therein according to the present invention.

A preferred embodiment of the present invention will be described with reference to accompanying drawings. As shown in FIG. 1, an electronic component unit 50 is encapsulated with molding resin 60 such as epoxy resin, thereby forming an electronic package 100. The electronic component unit 50 includes an electronic component 20 such as a semiconductor element mounted on a metallic member 50 with a connecting material 30 such as solder or epoxy resin and a lead wire 11 electrically connected to the electronic component 20 through a bonding wire 40. An entire surface of the electronic component unit 50 is covered with primer 70 made of a resin material such as polyamide or polyimide, so that the molding resin 60 firmly adheres to the electronic component unit 50.

The metallic member 10 is formed in a rectangular shape in this particular embodiment and is made of a metallic material such as copper, nickel or iron. The electronic component 20 may be a semiconductor element made of a material such as silicon (Si), silicon carbide (SiC) or gallium nitride (GaN). The electronic element is processed in known semiconductor processes. The electronic component 20 is electrically connected to the lead wire 11 made of copper, nickel or the like through the bonding wire 40 made of gold, aluminum or the like. An entire surface of the electronic component unit 50 (composed of the metallic member 10, the electronic component 20, a lead wire 11 and the bonding wire 40) is covered with the primer 70. Part of the lead wire 11 extends to an outside of the package 100 to be electrically connected to other electronic circuits.

The electronic package 100 is manufactured in a known process. Namely, the electronic component unit 50 is covered with the primer 70 by dipping the unit 50 into the primer 70 or by coating the surface of the unit 50 with the primer 70. Then, the unit 50 is set in a molding die and molded with the molding resin 60.

The molding resin 60 used in this embodiment is epoxy resin having a glass transition temperature higher than 200° C. The primer 70 also has a glass transition temperature higher than 200° C. This means that if the temperature of electronic package 100 reaches 200° C. due to heat generated inside or the ambient temperature, the adhesive force of the molding resin 60 is maintained, and the reliability of the electronic package 100 is secured.

In a conventional electronic package, the molding resin and the primer, both having the glass transition temperature higher than 200° C., have not been used. If the temperature of the package 100 becomes higher than the glass transition temperature of the molding resin, encapsulating ability of the molding resin deteriorates. Similarly, if the package temperature becomes higher than the glass transition temperature of the primer, adhesion ability of the primer cannot be maintained.

The glass transition temperature of the molding resin 60 and the primer 70 can be elevated to a temperature higher than 200° C. by various known ways. As for the molding resin 60, some exemplary ways are as follows: Epoxy resin having plural functional groups (more than three functional groups) are used; A bridging structure is introduced into a curing agent that forms bridging structures in the resin to thereby increase a density of bridging structures in the resin; Hybrid epoxy, which is made by introducing inorganic structures such as Si—O into epoxy resin, is used; or A denaturated amide/imide material is used. As for the primer 70, a material including an aromatic-amide-structure or an aromatic-imide-structure may be used.

It is confirmed through the tests that the reliability of the electronic package 100 is secured up to a temperature of 200° C. by setting the glass transition temperature of both of the molding resin 60 and the primer 70 to a temperature higher than 200° C. It is essential to raise the glass transition temperature to a temperature higher than 200° C. for both of the molding resin 60 and the primer 70. If the glass transition temperature is raised only for either the molding resin 60 or the primer 70, the reliability of the electronic package 100 cannot be secured up to 200° C. Some of the test results are shown in FIGS. 2 and 3.

As an embodiment of the present invention, the following sample are made: The metallic member 10 is made of Nickel (Ni), and the metallic member 10 is encapsulated with the molding resin 60 after the metallic member 10 is coated with primer 70. The glass transition temperature is set to 280° C. for the molding resin 60 and 290° C. for the primer 70. As a comparative example, the electronic package 100 is made by using a conventional molding resin 60 having the glass transition temperature of 170° C. and a conventional primer having the glass transition temperature of 230° C.

Figure 2:
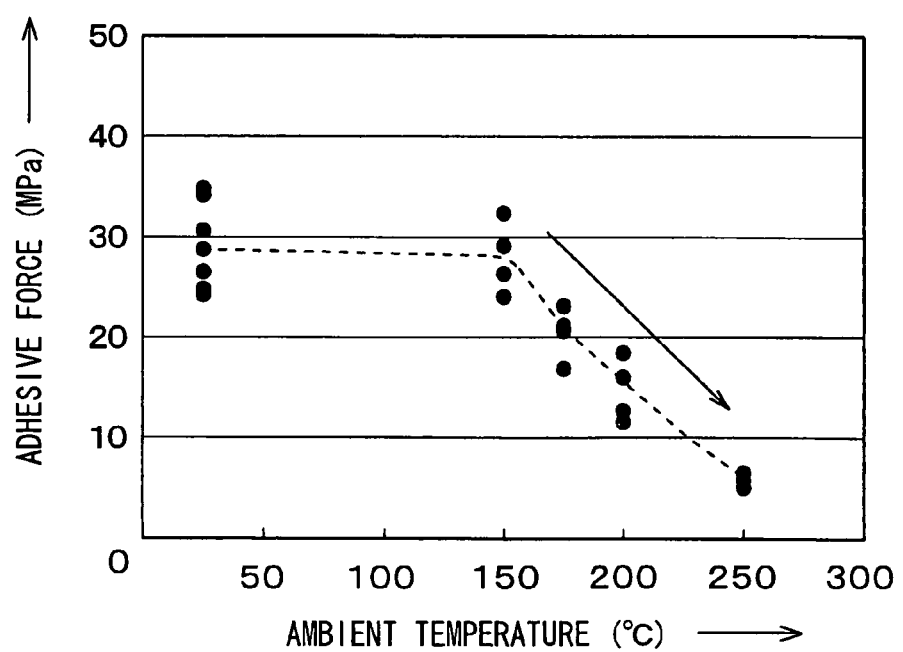
FIG. 2 is a graph showing an adhesive force of molding resin relative to the ambient temperature in a comparative example.
Figure 3:
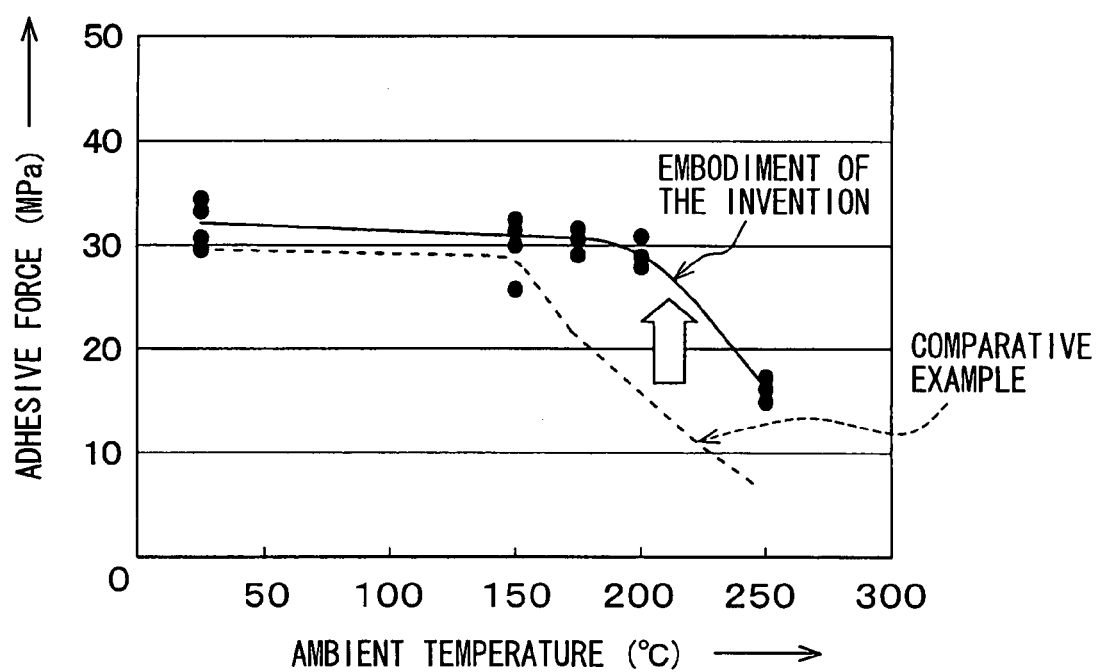
FIG. 3 is a graph showing an adhesive force of molding resin relative to the ambient temperature, in which an embodiment of the present invention and a comparative example are compared.

FIG. 2 shows the test results for the comparative example. An adhesive force (in MPa) of the molding resin is measured under various ambient temperatures. It is seen from the graph shown in FIG. 2 that the adhesive force is maintained at a sufficient level up to the ambient temperature of 150° C., but it rapidly decreases when the ambient temperature becomes higher than 150° C. FIG. 3 shows the test results for the embodiment of the present invention (the test results for the comparative example is also shown with a dotted line for comparison purpose). It is seen from the graph that the adhesive force of the molding resin is well maintained up to the ambient temperature of 200° C.

The glass transition temperature set in the embodiment of the present invention described above is only an example. The glass transition temperature for both of the molding resin 60 and the primer 70 may be variously changed as long as it is higher than 200° C. It is preferable, however, to set the glass transition temperature of both the molding resin 60 and the primer 70 at 250° C. or higher to have a certain margin.

The present invention is not limited to the embodiment described above, but it may be variously modified. For example, the semiconductor element 20 mounted on the metallic member 10 may be replaced with other electronic components such as a capacitor or a resistor element. Further, plural electronic components may be mounted on the metallic member 10. The lead wire 11 may not be used. In this case, part of the metallic member 10 may be extended to the outside of the molding resin 60 to make electrical connection. It is also possible to cover part of the electronic component unit 50 with the primer 70, instead of covering its entire surface.

While the present invention has been shown and described with reference to the foregoing preferred embodiment, it will be apparent to those skilled in the art that changes in form and detail may be made therein without departing from the scope of the invention as defined in the appended claims.

What is claimed is:

1. An electronic package comprising:
   an electronic component unit having a metallic member and an electronic component mounted on the metallic member;
   molding resin composed of epoxy resin for encapsulating the electronic component unit; and
   primer that is composed of a resin different from the molding resin and that is interposed between the electronic component unit and the molding resin for securing adhesion between the molding resin and the electronic component unit, wherein
   a glass transition temperature of each of molding resin and the primer is higher than 200° C., and
   the primer covers an entire surface of the electronic component unit.

2. The electronic package as in claim 1, wherein the electronic component unit further includes a lead wire electrically connected to the electronic component through a bonding wire.

* * * * *